(12) United States Patent
Roger et al.

(10) Patent No.: US 10,072,814 B2
(45) Date of Patent: Sep. 11, 2018

(54) LIGHTING DEVICE FOR A MOTOR VEHICLE, INCORPORATING MEANS FOR PROTECTION AGAINST ELECTROSTATIC DISCHARGES

(71) Applicant: Valeo Vision, Bobigny (FR)

(72) Inventors: Christophe Roger, Saint-Lambert-la-Potherie (FR); Pierre Placais, Avrille (FR); Jerome Jobard, Angers (FR)

(73) Assignee: VALEO VISION, Bobigny (FR)

( * ) Notice: Subject to any disclaimer, the term of this patent is extended or adjusted under 35 U.S.C. 154(b) by 92 days.

(21) Appl. No.: 15/041,394

(22) Filed: Feb. 11, 2016

(65) Prior Publication Data

US 2016/0238212 A1    Aug. 18, 2016

(30) Foreign Application Priority Data

Feb. 13, 2015 (FR) ...................... 15 51184

(51) Int. Cl.
| | |
|---|---|
| *F21S 45/10* | (2018.01) |
| *F21S 45/47* | (2018.01) |
| *H05K 9/00* | (2006.01) |
| *F21S 8/10* | (2006.01) |
| *F21S 41/19* | (2018.01) |
| *F21S 43/14* | (2018.01) |
| *B60Q 1/00* | (2006.01) |

(52) U.S. Cl.
CPC .............. *F21S 48/31* (2013.01); *F21S 41/192* (2018.01); *F21S 43/14* (2018.01); *F21S 45/10* (2018.01); *F21S 45/47* (2018.01); *H05K 9/0067* (2013.01); *B60Q 1/0088* (2013.01)

(58) Field of Classification Search
CPC ...... F21S 48/328; F21S 48/31; F21S 48/1109; H05K 9/0067; H01L 33/36; H01L 33/62
USPC .......................................... 362/520
See application file for complete search history.

(56) References Cited

U.S. PATENT DOCUMENTS

| | | | |
|---|---|---|---|
| 7,394,108 B2 | 7/2008 | Takeda et al. | |
| 8,337,061 B2 | 12/2012 | Kaak et al. | |
| 2002/0151200 A1 | 10/2002 | Fauser et al. | |
| 2006/0108597 A1 | 5/2006 | Takeda et al. | |
| 2010/0202151 A1 | 8/2010 | Kaak et al. | |
| 2012/0018764 A1* | 1/2012 | Choi | H01L 33/54 257/99 |
| 2014/0111894 A1* | 4/2014 | Schug | H01L 27/0248 361/56 |
| 2015/0224915 A1* | 8/2015 | Sazuka | B60Q 1/0088 362/516 |
| 2015/0230332 A1 | 8/2015 | Stiefel | |

FOREIGN PATENT DOCUMENTS

| | | |
|---|---|---|
| DE | 102012213843 B3 | 9/2013 |
| WO | 2014032914 A1 | 3/2014 |

* cited by examiner

*Primary Examiner* — Toan Ly
(74) *Attorney, Agent, or Firm* — Oblon, McClelland, Maier & Neustadt, L.L.P.

(57) ABSTRACT

A lighting device for a motor vehicle that includes one or more electronic circuits incorporating electronic components sensitive to an electrostatic discharge. The electronic components are protected by encouraging the controlled flow to ground of any electrostatic discharges. All portions of one or more electronic circuits can therefore be protected by preventing random electrostatic discharges liable to destroy or to degrade sensitive electronic components.

19 Claims, 1 Drawing Sheet

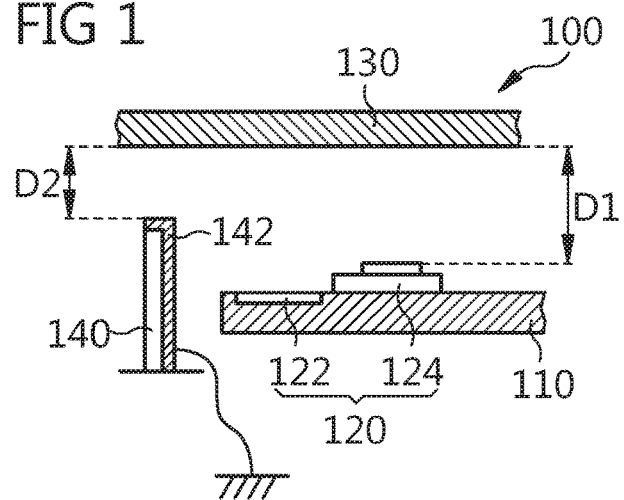
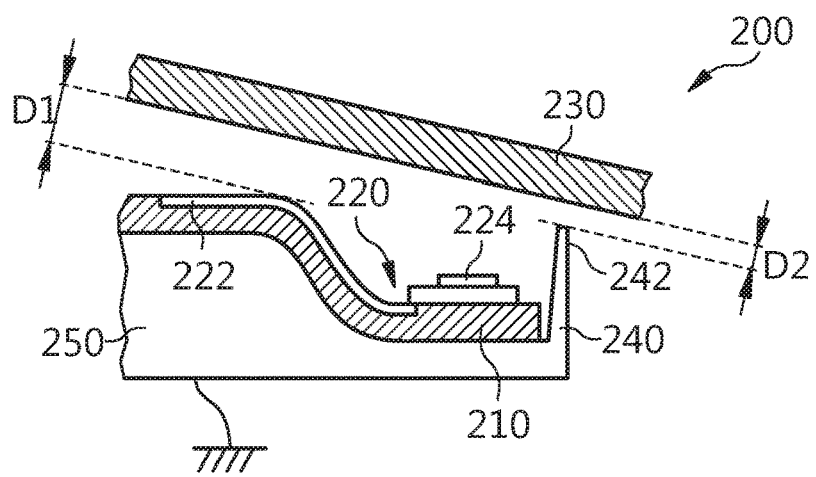
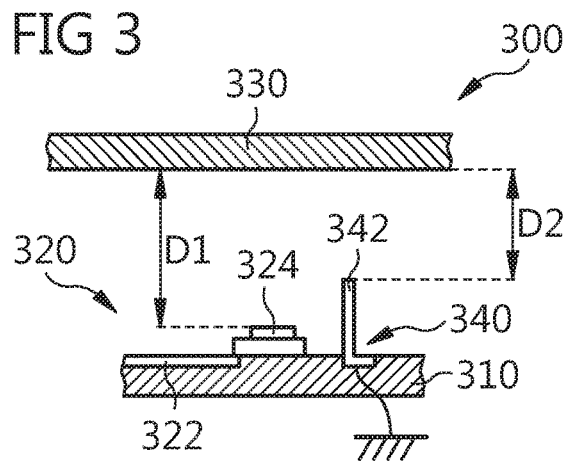

LIGHTING DEVICE FOR A MOTOR VEHICLE, INCORPORATING MEANS FOR PROTECTION AGAINST ELECTROSTATIC DISCHARGES

CROSS-REFERENCE TO RELATED APPLICATIONS

This application claims priority to the French application 1551184 filed Feb. 13, 2015, which application is incorporated herein by reference and made a part hereof.

BACKGROUND OF THE INVENTION

1. Field of the Invention

The invention relates to the field of lighting devices for a motor vehicle. The invention concerns in particular such devices using electronic components sensitive to electrostatic discharges, such as light-emitting diodes, for example.

2. Description of the Related Art

In the field of lighting devices for motor vehicles, the use of light sources such as light-emitting diodes (LED), organic light-emitting diodes (OLED) or laser diodes is increasingly specified. The placement of these lighting means along precise contours in actual fact makes it possible to create interesting and individual optical signatures. However, these are sensitive electronic components, notably sensitive to electrostatic discharges. During the service life of a motor vehicle, such components may be exposed to electrostatic discharges inside the headlight of which they form part. For example, because of friction of the external air on the outer lenses of a headlight, portions of the latter may come to carry static charges. If the light sources are subjected to discharges coming from these portions, there is a high risk of premature deterioration or even premature destruction of the electronic components.

In order to protect light sources, it is known to provide protection electronic circuits in the lighting device. For example, an electrical capacitor may be connected in parallel with an LED, the capacitor being able to absorb any surge. However, the cost of such a solution increases in proportion to the number of LEDs used. Moreover, such protection circuits occupy a large portion of the respective printed circuit boards, and the amount of room inside the device is limited.

The patent document US 2002/0151200 A1 describes a circuit element for protecting an electronic device from surges that occur within the electronic circuit including a sensitive component. Such a system can be useful only if the surge can occur only at a predefined location of the circuit to be protected. Means adapted to redirect the surge to ground on the upstream side of the sensitive component may then be incorporated in the circuit to the protected. Such a solution is not applicable to cases as described, however, in which an electrostatic discharge may occur at random to an electronic circuit including one or more sensitive components. As the discharge can occur in different portions of the circuit to be protected, this known solution is not able to solve the problem described.

SUMMARY OF THE INVENTION

An objective of the invention is to alleviate at least one of the problems raised by the prior art. To be more precise, an objective of the invention is to propose a lighting device incorporating protection of electronic components sensitive to an electrostatic discharge.

The invention consists in a lighting device for a motor vehicle. The device includes a substrate on which is arranged at least one element of an electronic circuit. The electronic circuit includes at least one electronic component sensitive to an electrostatic discharge. The device also includes a structure that is distinct from the substrate and liable to carry electrical charges. The shortest distance between the structure and each of the elements of the circuit is equal to $D1$. The device is noteworthy in that it includes at least one element protecting against electrostatic discharges having at least one electrically conductive surface portion electrically connected to ground, the shortest distance $D2$ between the surface portion and the structure being less than $D1$.

The protective element is therefore arranged so as to encourage an electrostatic discharge between the structure and the protective element relative to the elements of the electronic circuit and therefore makes it possible to protect those elements of the electronic circuit from the discharges. The protective element advantageously has the single function of protecting the electronic component against the electrostatic discharges.

The distance $D2$ may preferably be strictly less than 10 mm, whereas the distance $D1$ may be strictly greater than 10 mm.

The elements of the electronic circuit may preferably include electrically conductive tracks and electronic components connected to the tracks.

The protective element may preferably be a plastic material element, the surface portion being coated with an electrically conductive layer. This may be a layer of copper, aluminum or a metal alloy including an electrically conductive metal, for example.

The protective element may preferably have a base and extend from this base and taper to form a point. The surface portion may preferably cover the point of the protective element.

The protective element is preferably made from an electrically conductive metal or includes an electrically conductive metal alloy. The protective element may include copper or aluminum.

The protective element may preferably be disposed on the substrate. The element may be soldered to the substrate.

Alternatively, the protective element may be separate from the substrate.

The device may preferably include metal thermal dissipation means connected to ground. The protective element may preferably be formed on a surface of the thermal dissipation means. The protective element may for example take the form of a nose or a spike projecting relative to a plane surface of the thermal dissipation means. The protective element may preferably be made in one piece with the metal thermal dissipation means.

The substrate and the protective element may preferably be disposed on the same side of the structure.

The substrate may preferably be the plane substrate of a printed circuit board (PCB).

Alternatively, the substrate may be the substrate of an interconnection device (MID) having a complex geometry. The substrate of the interconnection device may be molded or machined.

The electronic component may preferably be a light-emitting diode (LED), a laser diode or an organic light-emitting diode (OLED). The electronic circuit may preferably include a plurality of LEDs, OLEDs or laser diodes sensitive to electrostatic discharges.

The electrical circuit may include a group including a plurality of electronic components sensitive to electrostatic discharges, the electronic components of this group being interconnected. In this case, the device may include a projector element associated with this group and that is adapted to protect all the electronic components of this group on its own.

The electrical circuit may preferably include a plurality of groups each including a plurality of electronic components sensitive to electrostatic discharges, the electronic components of each group being interconnected. In this case, the device may include a plurality of protective elements, each protective element being associated on a one-to-one basis with one of the groups and being adapted to protect all the electronic components of that group on its own.

The structure liable to carry electrical charges may preferably be an element of the outer lens of the lighting device.

The device may preferably be a front light or a rear light of a motor vehicle.

Compared to known solutions, the "lightning arrestor" effect produced by the features of the present invention makes it possible to reduce the manufacturing costs of a lighting device for a motor vehicle whilst providing long-lasting protection of the electronic components sensitive to electrostatic discharges. The measures in accordance with the invention define a low-impedance path between the structure liable to be charged and the protective element, thereby encouraging the creation of discharge paths between the structure, on the one hand, and the protective element on the other hand. In actual fact, as the distance D2 defined in accordance with the invention is less than the distance D1, the device encourages an electrostatic discharge between the structure liable to carry electrical charges and the protective element relative to the elements of the electronic circuit. The longevity of the electronic components and of the device are therefore increased and at the same time the complexity of the electronic circuits involved is reduced compared to known solutions. In actual fact, by applying the proposed invention, it is possible to dispense with dedicated protection circuits involving a capacitor for each of the light sources of such a device. This is of particular interest when a large number of such light sources, for example LEDs, is used in a lighting device in order to obtain a particular optical signature. One or more protection elements, easy to produce, and positioned in accordance with the features of the invention are capable of protecting a plurality of such light sources against random electrostatic discharges stemming for example from charges accumulated on a face of an outer lens of the device.

These and other objects and advantages of the invention will be apparent from the following description, the accompanying drawings and the appended claims.

BRIEF DESCRIPTION OF THE ACCOMPANYING DRAWINGS

Other features and advantages of the present invention will be better understood with the aid of the description of an example and the drawings, in which:

FIG. 1 shows diagrammatically a lateral section of a preferred embodiment of the device in accordance with the invention;

FIG. 2 shows diagrammatically a lateral section of a preferred embodiment of the device in accordance with the invention; and FIG. 3 shows diagrammatically a lateral section of a preferred embodiment of the device in accordance with the invention.

DETAILED DESCRIPTION OF THE PREFERRED EMBODIMENTS

In the following description, similar reference numbers will be used to describe similar concepts across different embodiments of the invention. Thus, the numbers 100, 200, 300 denote a device in accordance with the invention in three different embodiments.

Unless specifically indicated otherwise, the technical features described in detail for a given embodiment may be combined with the technical features described in the context of other embodiments described by way of nonlimiting example.

In the following description, components necessary for a lighting device for a motor vehicle to operate, but which have no direct impact on the present invention, will not be described explicitly, in order to preserve the clarity of the disclosure of the invention. In known manner, the light sources of a lighting device for a motor vehicle are supplied with power by a current source internal to the vehicle, such as the battery of the vehicle, and via a power supply control device generally including at least one converter. Suitable converters are known in themselves in the art and are able to convert an input direct current voltage into a different output direct current voltage suitable for the supply of power of the light source or sources of the device. A lighting device may also include in known manner optical means intended to guide the light rays emitted by the light source of sources or the device. These may be optical lenses and/or waveguides, for example. A device in accordance with the invention may further provide one or more lighting functions of the motor vehicle in which it is installed. These may be, by way of nonlimiting example, daytime running lamp, high-beam or turn indicator functions.

FIG. 1 shows a diagrammatic illustration of the elements of a device 100 in accordance with a preferred embodiment of the invention. The device 100 includes a substrate 110 that supports an electronic circuit 120. It may for example be a generally plane printed circuit board (PCB) or other substrates known in themselves in the art. The electronic circuit 120 includes conductive tracks 122 and components 124 connected by the conductive tracks 122. By way of nonlimiting example, a light-emitting diode (LED) 124 is shown. Although the substrate 110 shown supports only one circuit 120, it may generally include a plurality of separate circuits providing different functions. The formation of conductive tracks 122 on a substrate 110 and the fixing of the components to the substrate 110 are known in themselves in the art and will not be described in detail in the context of the present invention.

The device 100 also includes a structure 130 that is liable to carry, at least temporarily, electrical charges. It is for example an element of the outer lens of the lighting device 100, which may become electrically charged when the vehicle is driven because of friction with the external air. In FIG. 1, the structure 130 is shown as being plane. The structure 130 may nevertheless have different and more complex geometries. For example, the structure 130 may have a geometry that is curved in at least one direction. The shortest distance between the substrate 110 that supports the circuit 120 and the structure 130 is indicated by the measurement D1. The distance in question is considered between all the points of the surface of the structure 130 and all the points of the circuit 120 to be protected.

In order to prevent a charge present on the structure 130 being discharged to one of the elements of the electronic circuit 120, which would cause damage to the components 124, a protective element or protection element 140 is provided. The protection element 140 has the single function of protecting the electronic circuit 120 against electrostatic discharges. The protection element 140 may be made from a plastic material and coated over at least a portion of its surface 142 with an electrically conductive layer. Alternatively, the protection element 140 is made of electrically conductive material, for example copper alloy, copper or aluminum. In a preferred embodiment, the protection element 140 has a base from which it extends and its thickness decreases in the direction away from the base. The surface portion 142 ideally covers the thinnest portion, which is therefore that furthest away from the base, of the protection element 140. This example geometry may be considered equivalent to a spike having a point. The arrangement of the protection element 140 is such that a shortest distance between the electrically conductive surface portion 142 and the structure 130, indicated by the measurement D2, is less than the distance D1. For example, the distance D2 is strictly less than 10 mm whereas the distance D1 is strictly greater than 10 mm. These dimensions are obviously not limiting on the features of the invention. An electrical charge on the structure 130 seeks the evacuation path with the lowest impedance. Using the features of the invention, this path includes the surface portion 142 that is electrically connected to the zero potential or ground. The electrical charge on the structure 130 is therefore discharged via an electrical arc between the structure 130 and the surface portion 142, from which it is evacuated to ground. Such a discharge is therefore diverted from the circuit 120 without passing through the components 124 or the conductive tracks 122. The circuit 120 is therefore protected without adding additional electronic components to the circuit 120. The structure 130 including the surface portion 142 has the single function of protecting the electronic circuit 120 against electrostatic discharges.

The invention applies in an analogous manner to more complex geometries, both at the level of the structure 130 potentially carrying charges and at the level of the substrate 110 supporting the electronic circuit 120 to be protected. One example is illustrated by the FIG. 2 section, in which the circuit 220 including conductive tracks 222 and an LED 224 is part of a substrate 210 of MID ("molded interconnect device") type or of molded or machined interconnection device type. The production of such devices is known in itself in the art and notably makes it possible to produce electronic circuits on substrates that have a complex geometry. The device 200 shown includes thermal dissipation means 250 such as a metal heatsink. The thermal dissipation means 250 are connected to ground and are adapted to dissipate the heat produced by the components of the electronic circuit 220. In the example shown, the protection element 240 is fashioned in a surface of the thermal dissipation means 250. In this case, the protection element 240 is made in one piece with the metal thermal dissipation means 250. In accordance with the invention, a metal surface element 242 of the spike or protection element 240 projecting from a surface of the dissipation means 250 defines the path of lowest impedance for the charges coming from the structure 230.

The embodiment illustrated by the FIG. 3 diagram is similar to the arrangement shown in FIG. 1. However, the protection element 340 is formed on the substrate 310 that carries the electronic circuit 320 that is to be protected. The protection element 340 is for example produced directly in the plastic material of the substrate 310 and then metalized during the deposition of the metal layers that form the conductive tracks 320. Alternatively, the protection element 340 is formed entirely by chemical deposition of a conductive metal onto the substrate 310. A further alternative is for it to be a pin soldered to the substrate 310. In all cases the distance between the metalized surface portion 342 and the structure 330, indicated by D2, must be less than the shortest distance D1 between the surface and each of the elements 322, 324 of the circuit 320 that is to be protected. Moreover, the metalized surface portion 342 is electrically connected to ground.

Although in the embodiments that have just been described by way of example a single protective element 130, 230, 330 is shown, a plurality of similar elements may be disposed in the manner that has just been described. It goes without saying that the protective element or elements is or are adapted to protect any electronic circuit disposed on one or more substrates provided that the distance D2 as defined is less than the shortest distance between the structure liable to be charged and each of the elements of each of the circuits to be protected.

Provided that the distances D1 and D2 as defined between the structure liable to be charged and the electronic circuit, on the one hand, and the protection element, on the other hand, are complied with, the invention also includes embodiments in which the circuit and the protection element are disposed on respective opposite sides of the structure liable to be charged. Nevertheless, in the preferred embodiment, in which the structure liable to be charged in an element of the outer lens of the lighting device which marks the boundary between the interior and the exterior of the device, the circuit and the protection element are disposed on the same side of the structure, namely inside the lighting device.

Based on the description that has just been given and the accompanying figures, the application of the invention to more complex geometries will be obvious to the person skilled in the art having general background knowledge in the field.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A lighting device for a motor vehicle, said lighting device comprising:
   a substrate on which is arranged at least one element of an electronic circuit having at least one electronic component sensitive to an electrostatic discharge;
   a structure that is distinct from said substrate and liable to carry electrical charges, a shortest distance between said structure and said at least one element of said electronic circuit being equal to D1;
   at least one protective element configured to protect against electrostatic discharges having at least one electrically conductive surface portion electrically connected to ground, a shortest distance D2 between said at least one electrically conductive surface portion and said structure being less than said shortest distance D1; and metal thermal dissipation means connected to the ground, wherein said at least one protective element is formed on a surface of said metal thermal dissipation means, and wherein said at least one protective element is formed in one piece with said metal thermal dissipation means.

2. The lighting device according to claim 1, wherein said at least one protective element is a plastic material element, said at least one electrically conductive surface portion being coated with an electrically conductive layer.

3. The lighting device according to claim 2, wherein said at least one protective element is separate from said substrate.

4. The lighting device according to claim 2, wherein said substrate and said at least one protective element are disposed on the same side of said structure.

5. The lighting device according to claim 2, wherein said at least one electronic component is a light-emitting diode (LED), a laser diode or an organic light emitting diode (OLED).

6. The lighting device according to claim 2, wherein said structure is an element of an outer lens of said lighting device.

7. The lighting device according to claim 2, wherein said lighting device is a front light or a rear light of a motor vehicle.

8. The lighting device according to claim 1, wherein said at least one protective element is made of electrically conductive metal.

9. The lighting device according to claim 1, wherein said at least one protective element is separate from said substrate.

10. The lighting device according to claim 1, wherein said substrate and said at least one protective element are disposed on the same side of said structure.

11. The lighting device according to claim 1, wherein said substrate is a plane substrate of a printed circuit board (PCB).

12. The lighting device according to claim 1, wherein said substrate is a substrate of an interconnection device (MID) having a complex geometry.

13. The lighting device according to claim 1, wherein said at least one electronic component is a light-emitting diode (LED), a laser diode or an organic light emitting diode (OLED).

14. The lighting device according to claim 1, wherein said structure is an element of an outer lens of said lighting device.

15. The lighting device according to claim 1, wherein said lighting device is a front light or a rear light of a motor vehicle.

16. The lighting device according to claim 1, wherein said at least one protective element is arranged at an end portion of said metal thermal dissipation means.

17. The lighting device according to claim 1, wherein said metal thermal dissipation means is in direct contact with said substrate.

18. The lighting device according to claim 1, wherein said substrate has an upper surface that has a curved portion in a side sectional view of the lighting device.

19. The lighting device according to claim 18, wherein, in the side sectional view, a portion of said substrate is at a height greater than a maximum height of said at least one protective element.

* * * * *